United States Patent
Pan

(10) Patent No.: US 7,119,620 B2
(45) Date of Patent: Oct. 10, 2006

(54) METHOD AND SYSTEM FOR CONSTANT OR PROPORTIONAL TO ABSOLUTE TEMPERATURE BIASING FOR MINIMIZING TRANSMITTER OUTPUT POWER VARIATION

(75) Inventor: Michael (Meng-An) Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 88 days.

(21) Appl. No.: 11/000,622

(22) Filed: Nov. 30, 2004

(65) Prior Publication Data

US 2006/0114063 A1 Jun. 1, 2006

(51) Int. Cl.
*H03F 3/04* (2006.01)
*G05F 3/20* (2006.01)
*G05F 3/16* (2006.01)

(52) U.S. Cl. .............. 330/289; 330/285; 323/313; 323/316

(58) Field of Classification Search ......... 330/289, 330/285; 327/539; 323/313, 316
See application file for complete search history.

(56) References Cited

U.S. PATENT DOCUMENTS 6,465,997 B1 * 10/2002 Kussener ............... 323/313
6,489,835 B1 * 12/2002 Yu et al. ................ 327/539
6,501,256 B1 * 12/2002 Jaussi et al. ........... 323/315
6,724,176 B1 *  4/2004 Wong et al. ........... 323/316

* cited by examiner

*Primary Examiner*—Benny Lee
*Assistant Examiner*—Alan Wong
(74) *Attorney, Agent, or Firm*—McAndrews, Heid & Malloy, Ltd.

(57) ABSTRACT

In an RF communication system, aspects of constant or proportional to absolute temperature biasing for minimizing transmitter output power variation may comprise configuring at least one current source to provide a temperature dependent current, where the current may be constant with temperature or vary proportionally to absolute temperature. A control voltage that may be generated by an operational amplifier may be fed back to control the current source. An input reference voltage may also be generated for the operational amplifier by utilizing PN junction characteristics of at least one bipolar junction transistor. Resistance may be adjusted to allow operation of the current source at a plurality of different supply voltages, including the different supply voltages that may be less than 1.2 volts, for example. Additionally, adjusting the resistance may also allow the current to be constant with temperature or vary with temperature.

24 Claims, 5 Drawing Sheets

METHOD AND SYSTEM FOR CONSTANT OR PROPORTIONAL TO ABSOLUTE TEMPERATURE BIASING FOR MINIMIZING TRANSMITTER OUTPUT POWER VARIATION

CROSS-REFERENCE TO RELATED APPLICATIONS/INCORPORATION BY REFERENCE

This application makes reference to: U.S. patent application Ser. No. 11/000599 filed Nov. 30, 2004: and U.S. patent application Ser. No. 11/001438 filed Nov. 30, 2004.

The above stated applications are being incorporated herein by reference in their entirety.

FIELD OF THE INVENTION

Certain embodiments of the invention relate to transmitting radio frequency signals. More specifically, certain embodiments of the invention relate to a method and system for constant or proportional to absolute temperature (PTAT) biasing for minimizing transmitter output power variation.

BACKGROUND OF THE INVENTION

In some conventional systems, a transmitter may broadcast radio frequency (RF) signals. Generally, RF signals are generated by upconverting baseband signals to intermediate frequency (IF) signals, and then further upconverting the IF signals to RF signals. The RF signals may be amplified by power amplifiers before being transmitted by a transmit antenna. Because of a plurality of transmitters, for example, mobile communication handsets, wireless telephones, walkie-talkies, wireless home computer networks, etc., a strong transmitted signal may cause interference with other nearby transmitted signals.

In some instances, a transmitted signal may cause interference with a system that may be utilizing frequency re-use technique. With frequency re-use technique, multiple transmitters may be assigned a frequency to use, as long as the transmitters are far enough away from each other that their transmitted signals do not interfere with each other. The most common example of frequency re-use today may be cellular communication networks utilizing time-domain multiple access (TDMA) standard. The network operators take much care in ensuring that various frequency bandwidths are spread out among the plurality of cells such that transmitted signal in one cell does not overpower other transmitted signals in other cells of the same frequency bandwidth. Other frequency re-use examples are radio stations and television stations. The Federal Communications Commission (FCC) strictly regulates the broadcasting frequencies of the radio and television stations in order to keep neighboring stations from interfering with each other. The FCC also regulates the power output of the transmitting stations in order to keep distant stations from interfering with local stations that may be broadcasting at the same frequency.

In other instances, all transmitters may transmit in the same frequency bandwidth, but, still, care must be taken to ensure that no "rogue" transmitter transmits at too high power to "drown out" other transmitted signals. Code division multiple access (CDMA) system is an example where all transmitters transmit over the same frequency bandwidth. In CDMA, special algorithms are used to code and/or decode a specific signal of interest to a transmitter and/or a receiver. Although all receivers receive all signals transmitted, when a receiver's specific decoding code is utilized by a receiver, all other signals except the desired signal appears as random noise. However, if a transmitter transmits too much power, then that signal would appear as too much noise to other receivers, and the desired signals at other receivers may be drowned out by the noise. Therefore, a transmitted signal must be transmitted with enough power to be able to be received and decoded by a receiver, and yet must not have too much power that it interferes with other signals.

Generally, controlling output power of a transmitter is extremely important to minimize interference with other transmitted signals while still providing enough transmitted signal strength to be able to be received and processed by a receiver. In addition, a transmitter of limited power source, for example, mobile communication handset with a small battery, may need to accurately control power output in order to maximize battery life. However, a problem is that performance of various electronic devices, for example, resistors or semiconductor devices on integrated circuits (ICs or chips), etc., may be affected by temperature. As temperature rises, a resistor's resistance may increase, thereby affecting current and voltage, and vice versa as temperature decreases. Similarly, the current that a transistor conducts may vary as temperature changes. These changes may affect the power output of the transmitter.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of invention may be found in a method and system for constant or proportional to absolute temperature biasing for minimizing transmitter output power variation. Aspects of method may comprise configuring at least one current source to provide a current that may be related to temperature and adjusting resistance to vary the current that may be related to temperature. The current that may be related to temperature may be constant with temperature or may vary proportionally to absolute temperature. A control voltage, which may be generated by an operational amplifier, may be fed back to the current source to control the current source. An input reference voltage may also be generated for the operational amplifier by utilizing PN junction characteristics of at least one bipolar junction transistor. Additionally, resistance may be adjusted to allow operation of the current source at a plurality of different supply voltages, including the different supply voltages that may be less than 1.2 volts.

The method may further comprise utilizing the control voltage to generate a biasing voltage. The method may comprise utilizing the control voltage to control at least one current source, where a current from the current source may be used to generate a biasing voltage for an amplifier.

The method may further comprise coupling an output of the operational amplifier to a gate of a first transistor and to a gate of a second transistor, in which the first transistor and the second transistor may be the current sources utilized for the generation of the current related to temperature, which may be constant with temperature or vary proportionally to absolute temperature. A source of the first transistor and a source of the second transistor may be coupled to a higher potential of a voltage supply, in which the first transistor and the second transistor may be PMOS transistors. Furthermore, a drain of the first transistor may be coupled to a first terminal of a first resistor, to an emitter of a third transistor, and to a first input of the operational amplifier. The third transistor may be a PNP junction transistor, and the first input of the operational amplifier may a negative input of the operational amplifier. A drain of the second transistor may be coupled to a first terminal of a second resistor, to a first terminal of a third resistor, and to a second input of the operational amplifier. The second input of the operational amplifier may be a positive input of the operational amplifier. A second terminal of the second resistor may be coupled to an emitter of a fourth transistor.

The method may additionally comprise coupling the lower voltage potential of the voltage supply to a second terminal of the first resistor, to a second terminal of the second resistor, to a collector of the third transistor, to a base of the third transistor, to a base of the fourth transistor, and to a collector of the fourth transistor.

Aspects of system may comprise at least one current source configured to provide a current that may be related to temperature and circuitry to allow adjusting resistance to vary the current that may be related to temperature. The current that may be related to temperature may be constant with temperature or may vary proportionally to absolute temperature. An operational amplifier may be adapted to generate a control voltage that may be fed back to the current source to control the current source. The system may comprise circuitry for generating an input reference voltage for the operational amplifier, wherein the generation of the input reference voltage utilizes PN junction characteristics of at least one bipolar junction transistor. The system may further comprise circuitry to adjust resistance to allow operation of the current source at a plurality of different supply voltages, including the different supply voltages that may be less than 1.2 volts.

The system may further comprise circuitry that utilizes the control voltage to generate a biasing voltage. The system may comprise at least one current source, where the control voltage may control the current source, and where a current from the current source may be used to generate a biasing voltage for an amplifier.

The system may comprise a first transistor and a second transistor, wherein an output of the operational amplifier may be coupled to a gate of the first transistor and to a gate of the second transistor. The first transistor and the second transistor may be adapted to function as the current source utilized for generation of the current related to temperature, which may be constant with temperature or vary proportionally to absolute temperature. The system may further comprise a voltage supply whose higher potential may be coupled to a source of the first transistor and to a source of the second transistor. In one aspect of the invention, the first transistor and the second transistor may be PMOS transistors.

The system may also comprise a first resistor and a third transistor, in which a drain of the first transistor may be coupled to a first terminal of the first resistor, to an emitter of the third transistor, and to a first input of the operational amplifier. In one aspect of the invention, the third transistor may be a PNP junction transistor. The system may further comprise a second resistor and a third resistor, in which a drain of the second transistor may be coupled to a first terminal of the second resistor, to a first terminal of the third resistor, and to a second input of the operational amplifier. The first input of the operational amplifier may be a negative input of the operational amplifier, and the second input of the operational amplifier may be a positive input of the operational amplifier. A second terminal of the second resistor may be coupled to an emitter of a fourth transistor. The lower voltage potential of the voltage supply may be coupled to a second terminal of the first resistor, to a second terminal of the second resistor, to a collector of the third transistor, to a base of the third transistor, to a base of the fourth transistor, and to a collector of the fourth transistor.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for transmitter output power compensation. Various aspects of the invention may be utilized in, for example, a mobile communication handset, which may be adapted to transmit RF signals. Transmit power specifications for the handset may have a very narrow range, for example, 3 decibels-milliwatt (dBm), plus or minus 2 decibels (dBs), and operating temperature variation for the handset may cause the transmit power to drift out of the specified power range. An embodiment of the invention may compensate for transmitter power fluctuations due to temperature variations.

Figure 1B:
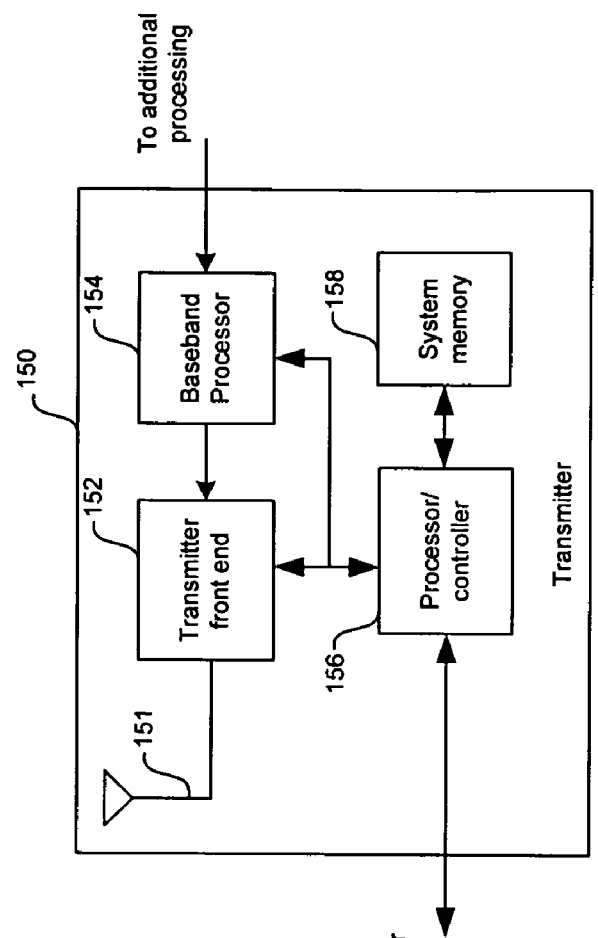
FIG. 1b is a block diagram of exemplary transmitter system of FIG. 1a that may be utilized in connection with an embodiment of the invention.
Figure 1A:
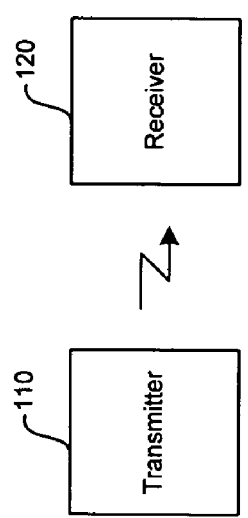
FIG. 1a is a block diagram of exemplary transmitter system and receiver system that may be utilized in connection with an embodiment of the invention.

FIG. 1a is a block diagram of exemplary transmitter system and receiver system that may be utilized in connection with an embodiment of the invention. Referring to FIG. 1a, there is shown a transmitter block 110 and a receiver block 120. The transmitter block 110 may comprise suitable logic, circuitry, and/or code that may be adapted to filter, modulate, and amplify a baseband signal to an RF signal, and transmit the RF signal. The receiver block 120 may comprise suitable logic, circuitry, and/or code that may be adapted to receive the RF signal and to demodulate the RF signal to the baseband signal.

In operation, the transmitter block 110 may be adapted to transmit RF signals over a wired or wireless medium. The receiver block 120 may be adapted to receive the RF signals and process it to a baseband signal that may be suitable for further processing, for example, as data or voice.

FIG. 1b is a block diagram of exemplary transmitter system of FIG. 1a that may be utilized in connection with an embodiment of the invention. Referring to FIG. 1b, the RF transmitter system 150 may comprise a transmitting antenna 151, a transmitter front end 152, a baseband processor 154, a processor 156, and a system memory 158. The transmitter front end (TFE) 152 may comprise suitable logic, circuitry, and/or code that may be adapted to upconvert a baseband signal to an RF signal and to transmit the RF signal via a transmitting antenna 151. The TFE 152 may be adapted to execute other functions, for example, filtering the baseband signal, and/or amplifying the baseband signal.

The baseband processor 154 may comprise suitable logic, circuitry, and/or code that may be adapted to process baseband signals, for example, convert an analog signal to a digital signal, and/or vice versa. The processor 156 may comprise suitable logic, circuitry, and/or code that may be adapted to control the operations of the TFE 152 and/or the baseband processor 154. For example, the processor 156 may be utilized to update and/or modify programmable parameters and/or values in a plurality of components, devices, and/or processing elements in the TFE 152 and/or the baseband processor 154. Control and/or data information, which may include the programmable parameters, may be transferred from at least one controller and/or processor, which may be external to the RF transmitter system 150, to the processor 156. Similarly, the processor 156 may be adapted to transfer control and/or data information, which may include the programmable parameters, to at least one controller and/or processor, which may be externally coupled to the RF transmitter block 110.

The processor 156 may utilize the received control and/or data information, which may comprise the programmable parameters, to determine an operating mode of the TFE 152. For example, the processor 156 may be utilized to select a specific frequency for a local oscillator, or a specific gain for a variable gain amplifier. Moreover, the specific frequency selected and/or parameters needed to calculate the specific frequency, and/or the specific gain value and/or the parameters needed to calculate the specific gain, may be stored in the system memory 158 via the processor 156. The information stored in system memory 158 may be transferred to the TFE 152 from the system memory 158 via the processor 156. The system memory 158 may comprise suitable logic, circuitry, and/or code that may be adapted to store a plurality of control and/or data information, including parameters needed to calculate frequencies and/or gain, and/or the frequency value and/or gain value.

Figure 2:
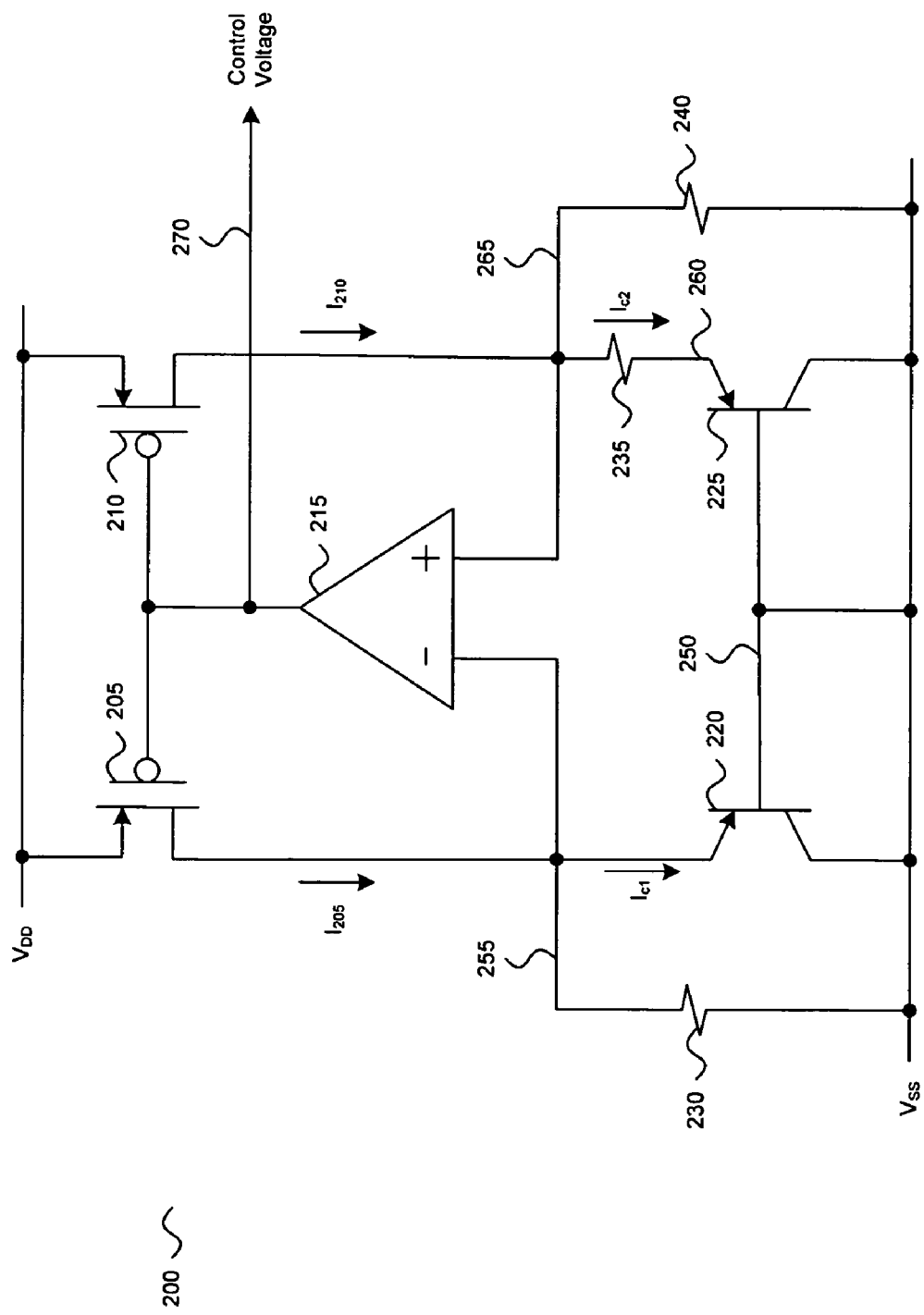
FIG. 2 is a block diagram illustrating exemplary current source controller, in accordance with an embodiment of the invention.

FIG. 2 is a block diagram illustrating an exemplary current source controller, in accordance with an embodiment of the invention. Referring to FIG. 2, there is shown a current source controller 200 that comprises PMOS transistors 205 and 210, an operational amplifier (op amp) 215, PNP junction transistors 220 and 225, and resistors 230, 235 and 240. Additionally, there is shown a plurality of voltages 250, 255, 260, 265 and 270.

A higher voltage potential $V_{DD}$ of a voltage supply may be communicated to a source of each of the PMOS transistors 205 and 210. A gate of each of the PMOS transistors 205 and 210 may be coupled to an output of the op amp 215. A drain of the PMOS transistor 205 may be coupled to a first terminal of the resistor 230, to an emitter of the PNP transistor 220, and to a negative input of the op amp 215. A drain of the PMOS transistor 210 may be coupled to a first terminal of each of the resistors 235 and 240, and to a positive input of the op amp 215. A second terminal of the resistor 235 may be coupled to an emitter of the PNP transistor 225. A lower voltage potential $V_{SS}$ of the voltage supply may be communicated to each second terminal of the resistors 230 and 240, to a collector of each of the PNP transistors 220 and 225, and to a base of each of the PNP transistors 220 and 225.

In operation, a control voltage 270 of the op amp 215 may be communicated to the gates of the PMOS transistors 205 and 210, and the PMOS transistors 205 and 210 may be adapted to function as current sources sourcing currents $I_{205}$ and $I_{210}$, respectively, in which $I_{205}$ may be the same amount of current as $I_{210}$. At equilibrium, if a resistance of the resistor 230 ($R_{230}$) is the same as a resistance of the resistor 240 ($R_{240}$), the voltage 255 ($V_{255}$) at the negative input of the op amp 215 may be the same as the voltage 265 ($V_{265}$) at the positive input of the op amp 215, and a current through PNP transistor 220 may be the same as a current through the PNP transistor 225. Therefore, the current through the resistor 230 ($I_{R230}$) may be $$I_{R230}=V_{255}/R_{230},$$

which may be equal to the current $I_{R240}$ through the resistor 240

$$I_{R240}=V_{265}/R_{240}$$

Furthermore, a PNP transistor may have a collector current $I_c$ that is defined by $$I_c=I_s*\exp(V_{be}/V_t)$$

where $I_s$ is a constant that is dependent on transistor geometry and $V_{be}$ is the base emitter voltage. Furthermore, $V_t$ is defined by $$V_t=KT/q$$

where K is Boltzmann's constant, $1.38 \times 10^{-23}$ Joules/Kelvin, T is temperature in Kelvin scale, and q is a charge of an electron, $1.6 \times 10^{-19}$ Coulombs. $V_{be}$ may then be defined by $$V_{be}=V_t*In(I_c/I_s).$$

Therefore, if $V_{be1}$ is the base emitter voltage for the PNP transistor 220, $V_{be2}$ is the base emitter voltage for the PNP transistor 225, $I_{c1}$ is the current through the PNP transistor 220, $I_{c2}$ is the current through the PNP transistor 225, $I_{s1}$ is the constant for the PNP transistor 220, and $I_{s2}$ is the constant for the PNP transistor 225, then $$V_{be1}=V_t*In(I_{c1}/I_{s1})$$

and $$V_{be2}=V_t*In(I_{c2}/I_{s2}).$$

Since $I_{c1}$ may be the same as $I_{c2}$, $$V_{be1}-V_{be2}=V_t*In(I_{c1}/I_{s1})-V_t*In(I_{c2}/I_{s2}) =V_t*In(I_{c1}/I_{s1})*(I_{s2}/I_{c2})) =V_y*In(I_{s2}/I_{s1}).$$

If the PNP transistor 225 is, for example, four times the size of the PNP transistor 220, then the equation reduces to:

$$V_{be1}-V_{be2}=V_t*In(4) =(KT/q)*In(4).$$

This voltage may be directly proportional to temperature and may be referred to as a proportional to absolute temperature (PTAT) voltage ($V_{PTAT}$). The $V_{PTAT}$ may also be a voltage across the resistor 235, which may have a resistance of $R_{235}$.

Additionally, the following equations may also describe the current from the PMOS transistor 205 ($I_{205}$), which may be equal to the current from the PMOS transistor 210 ($I_{210}$):

$$I_{205}=I_{R230}+I_{c1}=I_{210}=I_{R240}+I_{c2}=I_{R230}+I_{c2}=(V_{be1}/R_{230})+(V_{be2})/R=(1/R_{230})(V_{be1}+((V_{be1}-V_{be2})/(R_{235}/R_{230})))=(1/R_{230})(V_{be1}+(V_{PTAT}/(R_{235}/R_{230})))$$
$$=(1/R_{230})(V_{be1}+(V_{PTAT}*(R_{230}/R_{235})))$$

Since $V_{be1}$ and $V_{PTAT}$ both vary with temperature, if one varies inversely with temperature while the other varies directly with temperature, then by choosing correct values for $R_{230}$ and $R_{235}$, the current $I_{205}$, which may be equal to $I_{210}$, may be a constant current regardless of temperature. It may also be noted that choosing other values for $R_{230}$ and $R_{235}$ may result in a current that may vary with temperature. In that case, the currents $I_{205}$ and $I_{210}$ may be PTAT, and the proportionality with temperature may have different slopes depending on the resistances $R_{230}$ and $R_{235}$. These cases will be illustrated by FIGS. 3a, 3b, and 4. Each of the resistors 230, 235 and 240, may be a plurality of parallel resistors, and the resistance of each resistor 230, 235 and 240 may be adjusted by allowing current to flow through one or more of the plurality of parallel resistors. In that regard, each of the resistors 230, 235 and 240 may be under programmed control of a processor, for example, the processor 156 (FIG. 1b). The processor may communicate a value which may indicate which of the plurality of parallel resistors may conduct current.

Figures 3A, 3B:
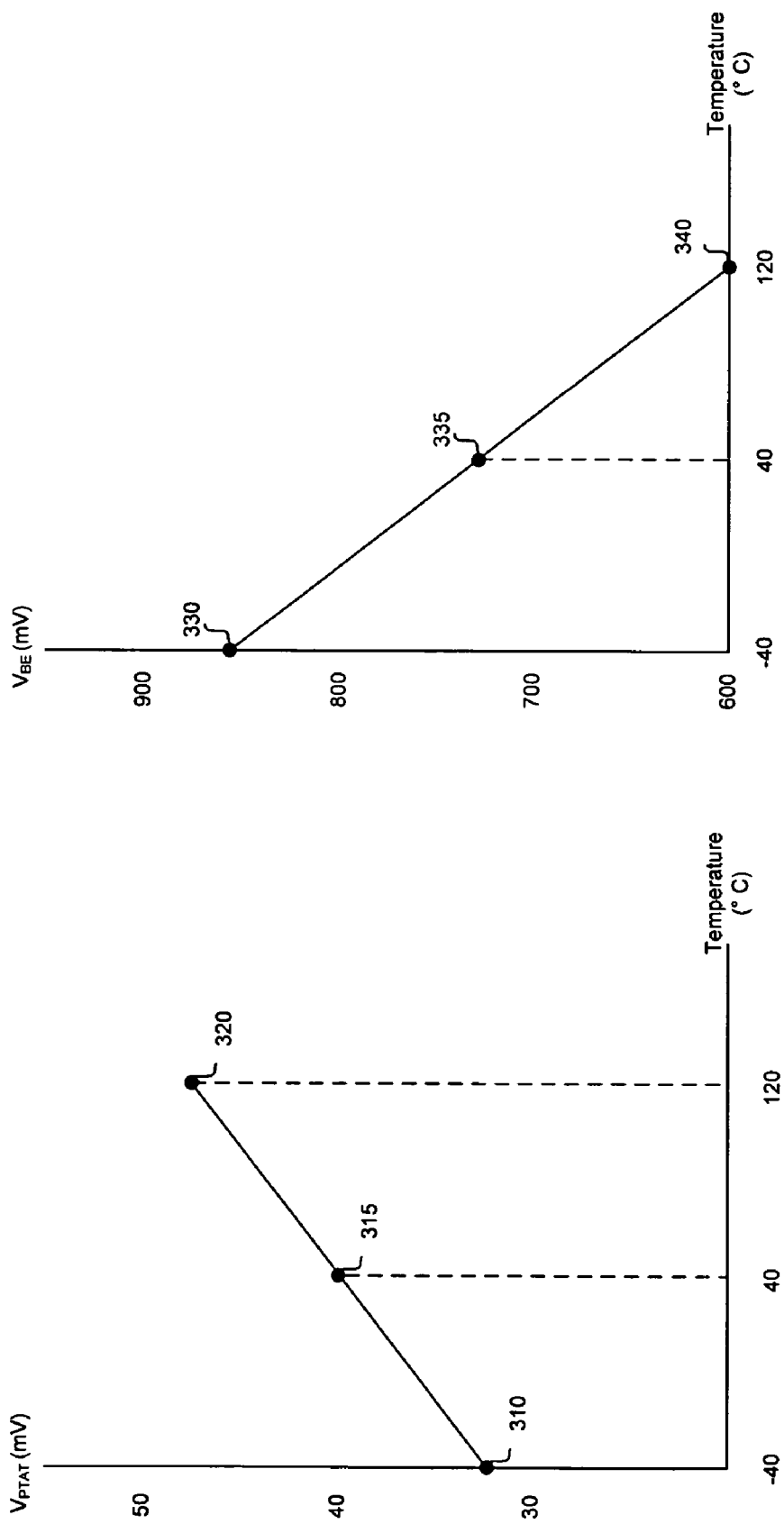
FIG. 3a is an exemplary graph of proportional to absolute temperature voltage ($V_{PTAT}$) versus temperature, in accordance with an embodiment of the invention.
FIG. 3b is an exemplary graph of base emitter voltage ($V_{BE}$) versus temperature, in accordance with an embodiment of the invention.

FIG. 3a is an exemplary graph of proportional to absolute temperature voltage ($V_{PTAT}$) versus temperature, in accordance with an embodiment of the invention. Referring to FIG. 3a, there is shown proportional to absolute temperature (PTAT) voltages $V_{PTAT}$ 310, 315 and 320 versus temperature. $V_{PTAT}$ 310 may be 28.8 mV at −40° C., $V_{PTAT}$ 315 may be 38 mV at 40° C., and $V_{PTAT}$ 320 may be 47 mV at 120° C., and the slope of $V_{PTAT}$ with respect to temperature may be 0.12 mV/degree. This slope may be determined by the expression (K/q)*ln(4). As described in FIG. 2, K is Boltzmann's constant, $1.38 \times 10^{-23}$ Joules/Kelvin, q is the charge of an electron, $1.6 \times 10^{-19}$ Coulombs, and the constant 4 is the ratio of the PNP junction transistor sizes, as described in FIG. 2. This graph may illustrate the variance of voltage across a resistor with respect to temperature.

FIG. 3b is an exemplary graph of base emitter voltage ($V_{BE}$) versus temperature, in accordance with an embodiment of the invention. Referring to FIG. 3b, there is shown measured junction transistor base-emitter voltages $V_{be1}$ 330, 335 and 340 versus temperature. $V_{be1}$ 330 may be 854 mV at −40° C., $V_{be1}$ 335 may be 730 mV at 40° C., and $V_{be1}$ 330 may be 600 mV at 120° C. The slope of $V_{be1}$ with respect to temperature may be −1.5 mV/degree. This may illustrate the variance of the base-emitter voltage of a junction transistor, and the base-emitter voltage may affect current flowing through a junction transistor.

Figure 4:
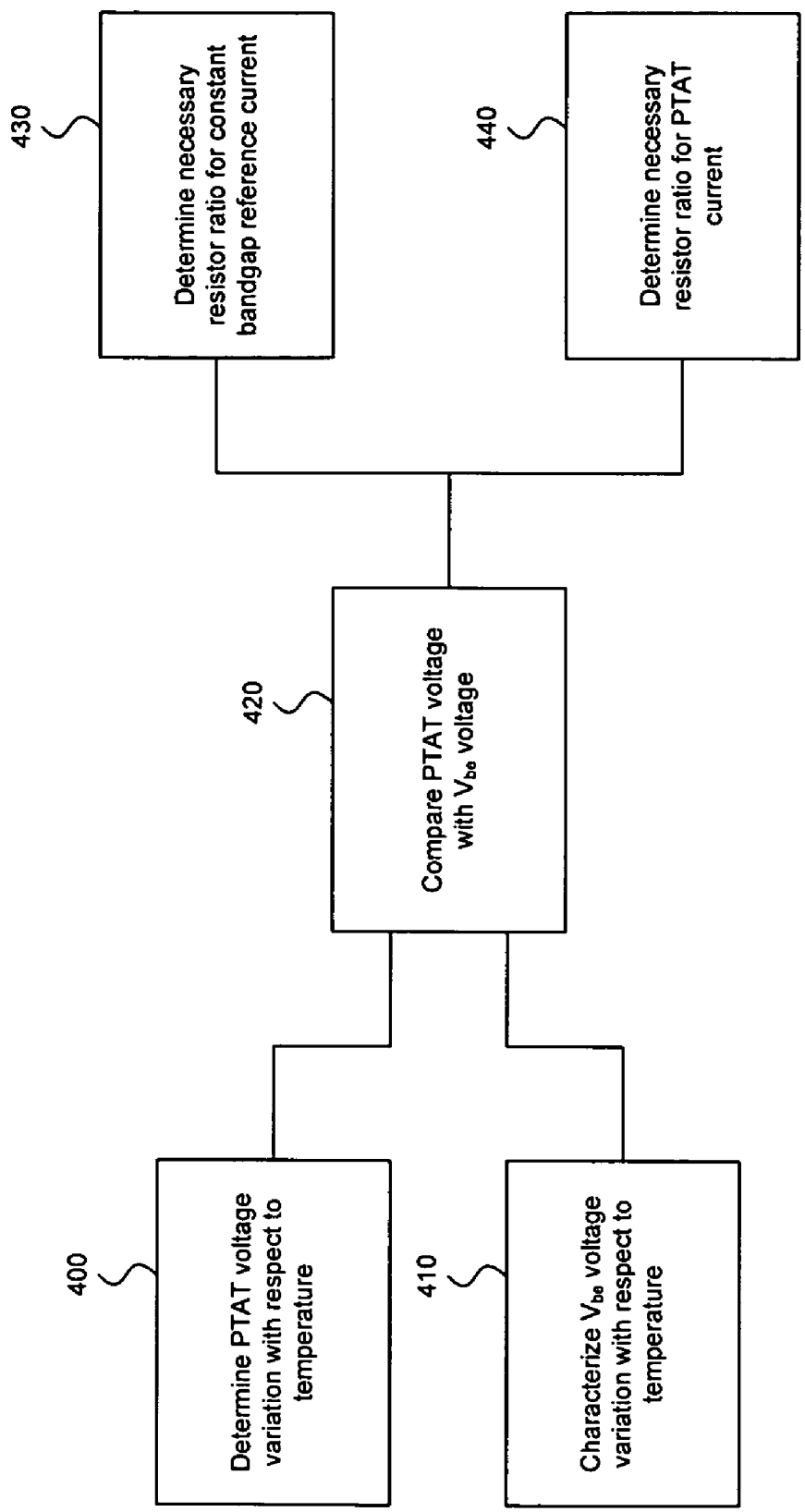
FIG. 4 is an exemplary flow diagram illustrating steps involved in generating constant bandgap reference current or proportional to absolute temperature (PTAT) current, in accordance with an embodiment of the invention.

FIG. 4 is an exemplary flow diagram illustrating steps involved in generating constant bandgap reference current or proportional to absolute temperature (PTAT) current, in accordance with an embodiment of the invention. In step 400, the $V_{PTAT}$ variation with respect to temperature may be determined. In step 410, the $V_{be1}$ variation with respect to temperature may be determined. In step 420, the $V_{PTAT}$ variation may be compared to $V_{be1}$ variation. In step 430, necessary resistor values may be chosen in order to generate a constant current independent of temperature. In step 440, necessary resistor values may be chosen in order to generate a PTAT current.

Referring to FIGS. 2, 3a, 3b, and 4, there is shown a plurality of steps 400 to 440 that may be utilized to implement a current source controller. In step 400, the $V_{PTAT}$ variation with respect to temperature may be determined, as illustrated by the graph in FIG. 3a. In step 410, the $V_{be1}$ variation with respect to temperature may be determined, as illustrated in FIG. 3b. In step 420, the $V_{PTAT}$ variation may be compared to $V_{be1}$ variation. The two voltages $V_{be1}$ and $V_{PTAT}$ have a ratio of $$V_{be1}/V_{PTAT}=(-1.5 \text{ mV/degree})/(0.12 \text{ mV/degree})=-12.5,$$

where the $V_{be1}$ changes 12.5 times as much as $V_{PTAT}$ per unit temperature. In step 430, the necessary resistor values may be chosen in order to generate a constant current independent of temperature. Since the equation derived in FIG. 2 shows that the current from each of the PMOS transistors 205 and 210 may be $$(1/R_{230})(V_{be1}+(V_{PTAT}*(R_{230}/R_{235}))),$$

choosing correct values of $R_{230}$ and $R_{235}$ may result in a constant current invariant with temperature. In step 420, it was determined that the $V_{be1}$ changed 12.5 times as much as $V_{PTAT}$ per unit temperature. Therefore, if the value of $R_{230}$ is 12.5 times larger than the value of $R_{235}$, the temperature effects on $V_{be1}$ and $V_{PTAT}$ will cancel and the resulting current will be a constant. The current through the resistor 230 (FIG. 2) may then be calculated as $$(1/R_{230})(V_{be1}+(V_{PTAT}*(R_{230}/R_{235}))).$$

This current may be utilized to provide a constant bias for devices such as, for example, amplifiers or analog-to-digital converters.

In step 440, the necessary resistor values may be chosen in order to generate a PTAT current. As shown in step 430, if the ratio of $R_{230}$ to $R_{235}$ is other than 12.5, the current through the resistor 230 may be PTAT, and the current versus temperature slope may vary depending on the values of $R_{230}$ and $R_{235}$. This current may be utilized to provide a PTAT bias for devices such as, for example, for example, amplifiers. Therefore, the biasing may be constant or PTAT, depending on the need, and may provide appropriate compensation for temperature variation that may otherwise affect operation.

Figure 5:
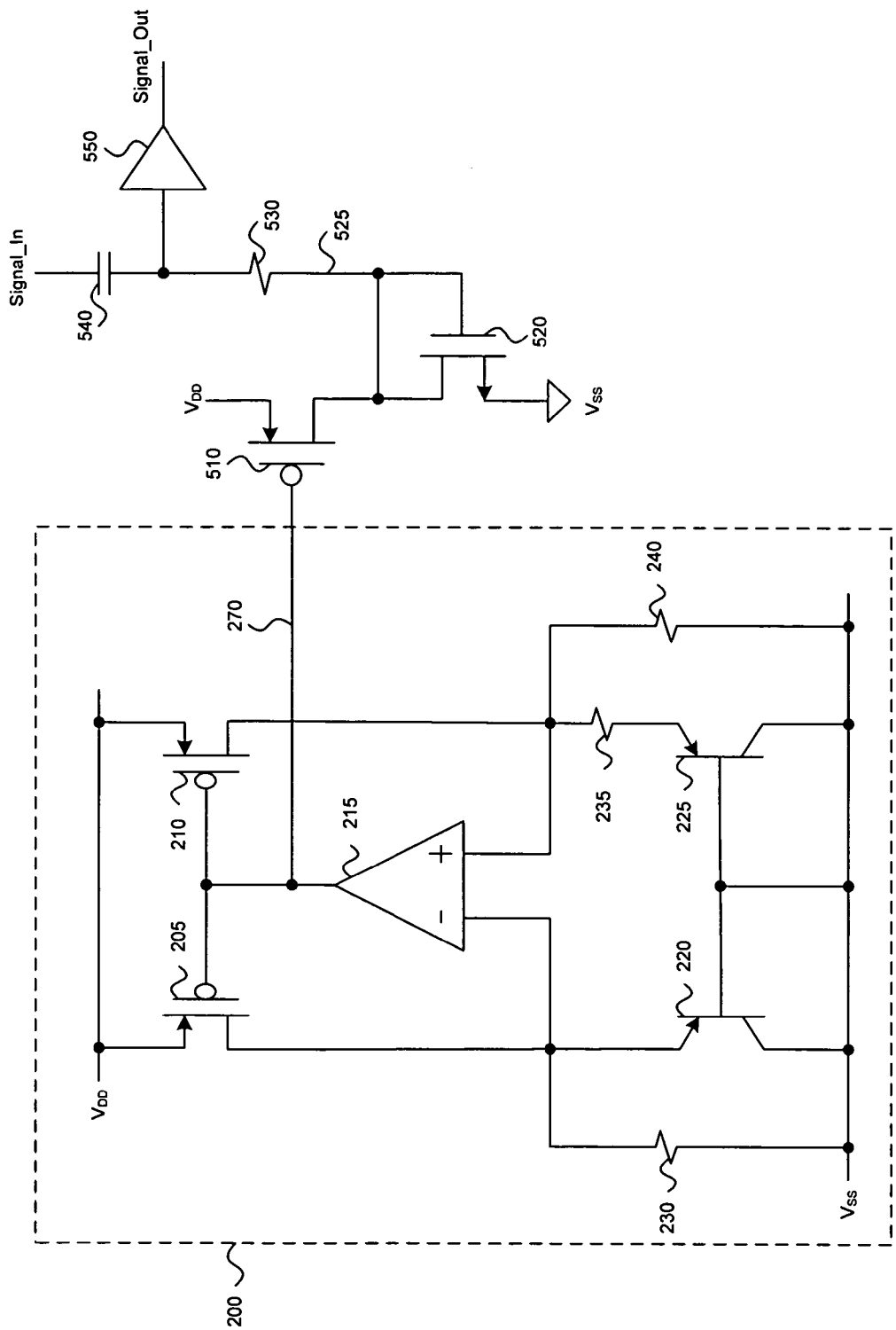
FIG. 5 is a block diagram illustrating an exemplary constant with temperature biasing or PTAT biasing, in accordance with an embodiment of the invention.

FIG. 5 is a block diagram illustrating an exemplary constant with temperature biasing or PTAT biasing, in accordance with an embodiment of the invention. Referring to FIG. 5, there is shown a current source controller 200, a PMOS transistor 510, an NMOS transistor 520, a resistor 530, a capacitor 540, an amplifier 550. The current source controller 200 may be substantially similar to the current source controller 200 described in FIG. 2. The amplifier 550 may comprise logic, circuitry, and/or code that may be adapted to amplify an input signal.

The current source controller 200 may communicate a control voltage 270 to a gate of the PMOS transistor 510. A drain of the PMOS transistor 510 may be coupled to a drain of the NMOS transistor 520, to a gate of the NMOS transistor 520, and to a first terminal of the resistor 530. The second terminal of the resistor 530 may be coupled to a first terminal of the capacitor 540 and to an input of the amplifier 550. A source of the PMOS transistor 510 may be coupled to a higher voltage potential of a voltage supply ($V_{DD}$), and a source of the NMOS transistor 520 may be coupled to a lower voltage potential of a voltage supply ($V_{ss}$).

In operation, the current source controller 200 may generate a control voltage 270 such that a current controlled by the control voltage 270 may be constant independent of temperature, or PTAT where the slope of the current versus temperature may be based on the values of $R_{230}$ and $R_{235}$, as described in FIG. 2. The control voltage 270 may be communicated to the gate of the PMOS transistor 510. The PMOS transistor 510 may then generate a bias current, which may be independent of temperature or PTAT with a desired slope of current versus temperature, that may be communicated to the drain and to the gate of the NMOS transistor 520, and to the first terminal of the resistor 530. Therefore, a bias voltage 525 at the gate of the NMOS transistor 520, which may generate the bias current in the amplifier 550, may be constant with respect to temperature or may have some generated slope of PTAT as explained in FIG. 2. The bias voltage 525 may be communicated to an input of the amplifier 550 and to the capacitor 540 via the resistor 530. Because the capacitor 540 and the input of the amplifier 550 may have very high resistance to the bias voltage 525, an effective open circuit may exist, and therefore the bias voltage at the input of the amplifier may be the same as the bias voltage 525.

An RF input signal Signal_In, which may be the signal that is to be amplified, may be communicated to a second terminal of the capacitor 540 along with a DC offset voltage that may exist for the RF input signal Signal_In. The capacitor 540 may be an effective short circuit to the RF input signal Signal_In, and therefore the RF input signal Signal_In may be transferred across the capacitor 540 to the first terminal of the capacitor 540. However, since capacitors are open circuits to DC voltages, the DC offset voltage may be blocked by the capacitor 540. The RF input signal Signal_In may generate a voltage across the resistor 530, and this voltage may add to the bias voltage at the input of the amplifier that may be the same as the bias voltage 525. Therefore, the amplifier 550 may receive as input the RF input signal Signal_In that may be biased by a bias voltage 525 at the gate of the NMOS transistor 520. The bias voltage 525, which may generate the bias current in the amplifier 550, may be constant with respect to temperature or may have some generated slope of PTAT as explained in FIG. 2. In accordance with an aspect of the invention, the bias voltage 525 may be generated via suitable circuitry adapted to minimize output power variation based on design parameters.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for controlling output power in a communication device, the method comprising:
   configuring at least one current source to provide a current related to temperature;
   adjusting resistance to vary said current related to temperature from said at least one current source;
   feeding back a control voltage generated from an operational amplifier to control said at least one current source;
   generating an input reference voltage for said operational amplifier utilizing PN junction characteristics of at least one bipolar junction transistor;
   adjusting resistance to allow operation of said at least one current source at a plurality of different supply voltages; and
   compensation for change in gain of an amplifier being biased by said at least one current source when said temperature changes.

2. The method according to claim 1, wherein said current related to temperature is constant with temperature.

3. The method according to claim 1, wherein said current related to temperature varies proportionally to absolute temperature.

4. The method according to claim 1, further comprising coupling an output of said operational amplifier to a gate of a first transistor and to a gate of a second transistor, wherein said first transistor and said second transistor are said at least one current source utilized for said generation of said current related to temperature.

5. The method according to claim 4, further comprising coupling a source of said first transistor and a source of said second transistor to a higher potential of a voltage supply, wherein said first transistor and said second transistor are PMOS transistors.

6. The method according to claim 4, further comprising coupling a drain of said first transistor to a first terminal of a first resistor, to an emitter of a third transistor, and to a first input of said operational amplifier, wherein said third transistor is a PNP junction transistor.

7. The method according to claim 4, further comprising coupling a drain of said second transistor to a first terminal of a second resistor, to a first terminal of a third resistor, and to a second input of said operational amplifier.

8. The method according to claim 7, further comprising coupling a second terminal of said second resistor to an emitter of a fourth transistor.

9. The method according to claim 1, wherein a first input of said operational amplifier is a negative input.

10. The method according to claim 1, wherein a second input of said operational amplifier is a positive input.

11. The method according to claim 1, further comprising coupling a lower voltage potential of a voltage supply to a second terminal of a first resistor, to a second terminal of a second resistor, to a collector of a third transistor, to a base of said third transistor, to a base of a fourth transistor, and to a collector of said fourth transistor.

12. The method according to claim 1, wherein said plurality of different supply voltages is less than 1.2 volts.

13. A system for output power control, the system comprising:
- at least one current source configured to provide a current related to temperature;
- circuitry to adjust resistance to vary said current related to temperature from said at least one current source;
- an operational amplifier generating a control voltage that is fed back to control said at least one current source;
- circuitry for generating an input reference voltage for said operational amplifier, wherein said generation of said input reference voltage utilizes PN junction characteristics of at least one bipolar junction transistor; and
- circuitry to adjust resistance to allow operation of said at least one current source at a plurality of different supply voltages; and
- circuitry to compensate for change in pain of an amplifier being biased by said at least one current source when said temperature changes.

14. The system according to claim 13, wherein said current related to temperature is constant with temperature.

15. The system according to claim 13, wherein said current related to temperature varies proportionally to absolute temperature.

16. The system according to claim 13, further comprising a first transistor and a second transistor, wherein an output of said operational amplifier is coupled to a gate of said first transistor and to a gate of said second transistor, and wherein said first transistor and said second transistor are said at least one current source utilized for said generation of said current related to temperature.

17. The system according to claim 16, further comprising a voltage supply, wherein a source of said first transistor and a source of said second transistor are coupled to a higher potential of said voltage supply, and wherein said first transistor and said second transistor are PMOS transistors.

18. The system according to claim 16, further comprising a first resistor and a third transistor, wherein a drain of said first transistor is coupled to a first terminal of said first resistor, to an emitter of said third transistor, and to a first input of said operational amplifier, wherein said third transistor is a PNP junction transistor.

19. The system according to claim 16, further comprising a second resistor and a third resistor, wherein a drain of said second transistor is coupled to a first terminal of said second resistor, to a first terminal of said third resistor, and to a second input of said operational amplifier.

20. The system according to claim 19, further comprising a fourth transistor, wherein a second terminal of said second resistor is coupled to an emitter of said fourth transistor.

21. The system according to claim 13, wherein a first input of said operational amplifier is a negative input.

22. The system according to claim 13, wherein a second input of said operational amplifier is a positive input.

23. The system according to claim 13, further comprising a first resistor, a second resistor, a third transistor, a fourth transistor, and a voltage supply, wherein a second terminal of said first resistor, a second terminal of said second resistor, a collector of said third transistor, a base of said third transistor, a base of said fourth transistor, and a collector of said fourth transistor are coupled to a lower voltage potential of said voltage supply.

24. The system according to claim 13, wherein said plurality of different supply voltages is less than 1.2 volts.

* * * * *